United States Patent [19]

Coster

[11] Patent Number: 4,835,491
[45] Date of Patent: May 30, 1989

[54] CLOCK SIGNAL GENERATION

[75] Inventor: John H. Coster, Dunfermline, Scotland

[73] Assignee: Hewlett-Packard Company, Palo Alto, Calif.

[21] Appl. No.: 147,838

[22] Filed: Jan. 25, 1988

[30] Foreign Application Priority Data

Feb. 12, 1987 [EP] European Pat. Off. ........... 87301206

[51] Int. Cl.[4] ............................................. H03L 7/06
[52] U.S. Cl. .......................................... 331/2; 331/25
[58] Field of Search ....................... 331/1A, 2, 18, 25; 455/260; 328/14; 307/529

[56] References Cited

U.S. PATENT DOCUMENTS 3,775,665  11/1973  Sample .
4,191,930   3/1980  Harzer ............................. 331/25 X

FOREIGN PATENT DOCUMENTS 0093433  4/1983  European Pat. Off. .
2746507  4/1979  Fed. Rep. of Germany .
3314973  7/1984  Fed. Rep. of Germany .

OTHER PUBLICATIONS

"High Resolution Broadband Microwave Synthesizer", Valy and Toth; Proceeding Autotestcon '85 *IEEE International Automatic Testing Conference*, Oct. 22-24, 1985; IEEE; Long Island, N.Y.; pp. 265-267.
"Microprocessor-controlled Phase-locked Signal Source"; Evans and Jenkins; *Radio & Electronic Engineer*, Institute of Electronic and Radio Engineers, London, GB; Dec. 1978; vol. 48; pp. 593-602.

*Primary Examiner*—Eugene R. LaRoche
*Assistant Examiner*—Robert J. Pascal
*Attorney, Agent, or Firm*—Karl E. Bring

[57] ABSTRACT

A clock signal generator is based on a phase locked loop arrangement. The loop includes an adjustable divider. The reference signal for the loop is applied to another adjustable divider. This allows the generation of a wide range of frequencies by appropriate selection of the division ratios.

11 Claims, 2 Drawing Sheets

CLOCK SIGNAL GENERATION

BACKGROUND OF THE INVENTION

This invention relates to clock signal generation. In some applications, e.g. in telecommunications testing equipment, clock signal generators are required to produce signals at a set of specific clock frequencies with high accuracy, typically 5 parts per million (ppm). Clock signal generators are known which are based on voltage controlled crystal oscillators. A set of clock frequencies can be produced by providing the clock signal generator with a set of crystal oscillators one for each required frequency. It is also known to provide a small offset from each set frequency by connecting a variable capacitance device in the crystal circuit of each oscillator. By varying the capacitance of the device the frequency of each oscillator can be varied by approximately 100 ppm from its nominal value.

There is a need for a clock signal generator which can produce a wide range of accurately defined frequencies without increasing the number of crystal oscillators. The present invention is concerned with a clock signal generator which aims to meet this need.

SUMMARY OF THE INVENTION

According to the present invention there is provided a clock signal generator of the type comprising a phase locked loop arrangement which includes adjustable dividing means for adjusting the clock signal rate at the output of the loop and means for generating a reference signal for the loop, characterized in that the signal generator includes a further adjustable dividing means coupling the reference signal generating means to the loop.

By careful selection of the division ratios of the loop dividing means and the reference signal dividing means a wide range of output frequencies can be produced. The range of frequencies can be increased when the reference signal generating means is a voltage controlled crystal oscillator by causing the frequency of the oscillator to offset from its nominal value. This can be achieved, for example by providing a variable capacitance device in the crystal circuit thereby enabling the nominal frequency of the crystal oscillator to be varied by varying said capacitance. The frequency of the crystal oscillator may be controlled by means of feedback control loop. The division ratios of the dividing means may be set automatically under the control of a microprocessor which can also control the crystal oscillator.

The invention will be described now by way of example only with particular reference to the accompanying drawings.

DESCRIPTION OF THE PREFERRED EMBODIMENT

Figure 1:
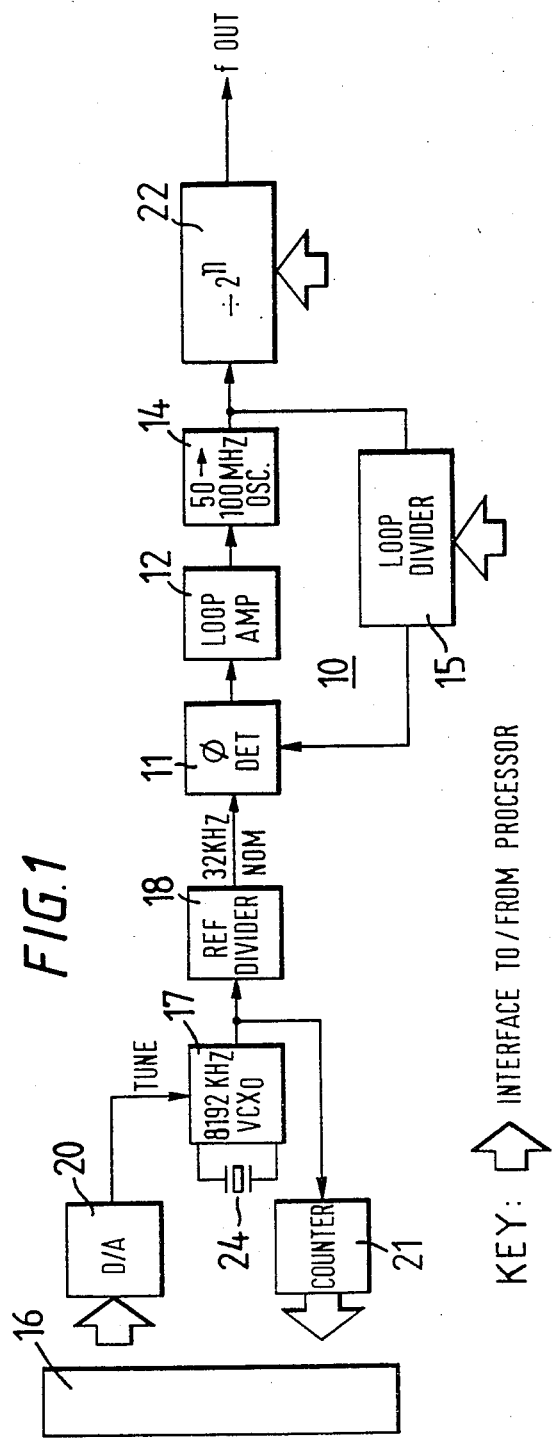
FIG. 1 is a block schematic diagram illustrating a clock generator synthesizer in accordance with the present invention.

Referring initially to FIG. 1 a digital clock signal generator includes a phase locked loop arrangement 10 which includes a phase detector 11 a loop amplifier 12 an oscillator 14 and a loop divider 15. The loop divider 15 is a variable device which can be set to a selected value under the control of a microprocessor 16 as will be explained later. A reference signal for the phase locked loop 10 is derived from a voltage controlled crystal oscillator 17 which is coupled to the loop 10 by way of a reference divider 18. The reference divider 18 is also a variable device which can be set to a selected value under the control of the same microprocessor 16.

The voltage controlled oscillator can be tuned in response to the output from a digital to analog converter 20 which receives control signals from the microprocessor 16. The output from the voltage controlled oscillator 17 is also fed to a counter 21 which supplies a count signal to the microprocessor 16.

The output from the phase locked loop 10 is fed to a divider 22 to provide the clock output signal.

In operation the phased lock loop produces an output signal whose frequency is a multiple of the reference input frequency from the output of the divider 18. This operation will be apparent to those skilled in the art and therefore will not be described in detail. It will be appreciated that by making the divider 15 variable a range of discrete frequencies can be produced at the output of the phase locked loop. Thus assuming that the signal applied to the loop is a fixed frequency f then the output will be N×f depending upon the value to which the divider 15 is set.

In the present arrangement the divider 18 is also variable. By appropriate selection of the values of the reference divider 18 and the loop divider 15 it is possible to produce a selected one of a plurality of very closely spaced frequencies at the output of the loop 10. The output frequency F(L) is given by the following expression:

$$F(L) = \frac{N \times F}{M}$$

where M is the division ratio of the divider 18, and F is the frequency of the input to the divider 18.

In addition it is also possible using a variable capacitance device 24 in the crystal circuit of the crystal oscillator to allow the frequency of the oscillator 17 to vary slightly about its nominal value. This variation in conjunction with the variation provided by the dividers 18 and 15 allows an almost substantially continuous range of output frequencies to be produced at the output of the loop 10.

When a frequency value is selected by a user the voltage controlled oscillator 17 is tuned by means of a feedback loop which comprises the counter 21 and the digital to analog converter 20 operating in conjunction with the microprocessor 16. When the generator is set to produce a particular output frequency the offset applied to the oscillator 17 is controlled by the output of the digital to analog converter 10 according to signals provided from the microprocessor 16. The counter 21 senses the actual value of the offset by measuring the frequency of the output of the oscillator 17. The counter is interrogated by the microprocessor which then provides if necessary a correction signal for adjusting the offset in order to provide the required value. Thus if the processor is set to provide for a specific offset it initially makes a first estimate of the value needed by instructing the digital to analog converter 20 to provide that offset. It then interrogates the counter to find the actual offset and then makes any necessary corrections by re-measuring the reference frequency until the correct value is produced. The feedback loop is necessary because the relationship between the offset and the signal applied by the converter 20 is not linear.

It will be appreciated that for any desired output frequency there are optimum values for the division ratio of the dividers 18 and 15. These can be provided for example in the form of a look-up table stored in a memory associated with the microprocessor 16. Each time a frequency is selected the microprocessor interrogates the look-up table and provides the necessary signals to set the dividers to the optimum division ratios.

The output from the loop 10 is applied to a binary divider 22 to obtain the appropriate output frequency. The binary divider also has the function of providing a good mark to space ratio since each transition of the output wave form will occur for example on a rising transition of the output from the loop 10.

A practical version of the generator shown in FIG. 1 uses an oscillator 17 which is designed to operate at a nominal frequency of 8192 KHz. This is a useful frequency since it is a multiple of 64 KHz and 32 KHz which are commonly used in digital communications applications. For example the 8192 KHz oscillator can be divided by 256 to give a 32 KHz reference for application to the loop 10. The loop oscillator 14 will typically have a range of 50 to 100 MHz.

A point to note is that the counter 21 used in the loop to tune the oscillator 17 only has to work at the reference frequency of the generator loop. It only requires sufficient stages to measure the offset of the reference frequency as the nominal frequency is known. For example with the 8192 KHz referred to an offset of $\pm 100$ ppm is $\pm 819.2$ Hz so that the frequency from the oscillator 17 will vary approximately from 8191 to 8193 KHz. Thus the counter 21 only requires sufficient stages to count the leading 819 pulses.

Other reasons for using an oscillator 17 operating at a multiple of 64 KHz are as follows:

1. Because of the characteristics of quartz crystals it is easier to obtain small, frequency pullable crystals at 8 megahertz than at 64 kilohertz.

2. To speed up the counter gate time to obtain the required resolution for offset count. A standard counter with a one second gate time would have a resolution of 1 Hz. Thus counting for one second at 64 KHz would provide a resolution of 1 in 64,000 i.e. 15.6 ppm. At 8192 KHz the resolution is one in 8192000 i.e. 0.122 ppm. The required gate time to obtain a resolution of 1 ppm at 64 KHz would be about 16 seconds. This would mean a long wait for a user when changing the offset of the synthesizer.

Figure 2:
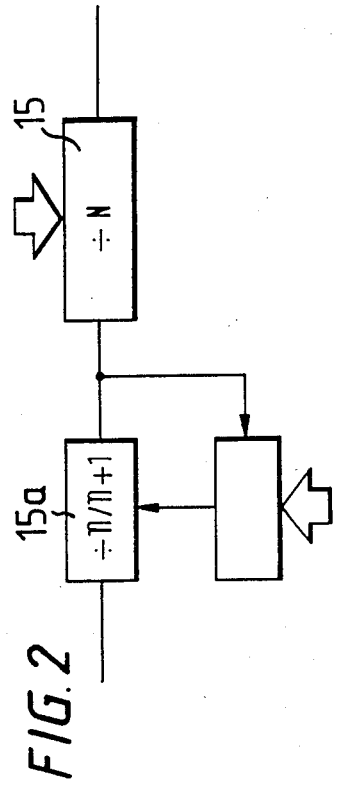
FIG. 2 is a diagram illustrating part of the synthesizer of FIG. 1.

The divider in the loop 10 can be implemented using a dual modulus prescaler. FIG. 2 illustrates this type of arrangement which will be apparent to those skilled in the art. This is a particularly convenient form of implementation since it permits much of the divider to be implemented in CMOS. The additional stage 15a in the divider can either divide by the value n or by n+1. For part of an operating cycle it operates at n+1 and for the remainder thereof at n. This is carried out under the control of the microprocessor according to the particular division ratio in operation at the time.

Figure 3:
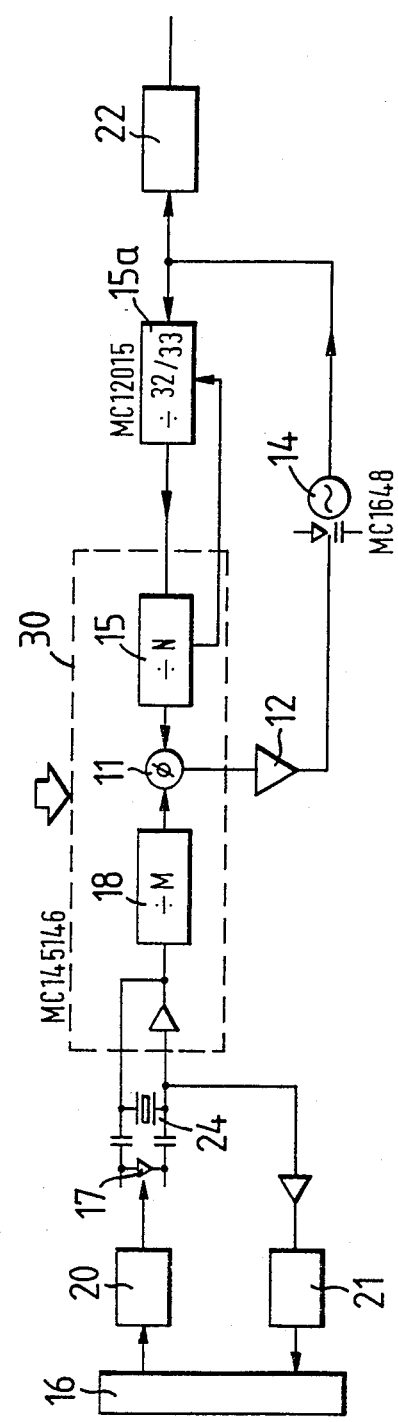
FIG. 3 illustrates in more detail a clock signal generator in accordance with the present invention.

FIG. 3 shows a clock generator incorporating the dual modulus prescaler. This Figure also shows how some elements can be implemented in commercially available components. The elements shown within the dotted line 30 can be implemented using an MC 145146 device and the element 15a can be an MC 12015. The loop oscillator 14 can be an MC 1648.

The microprocessor can be any suitable device and typically will be part of an apparatus with which the generator is to be used, e.g. a bit error rate tester.

What is claimed is:

1. A clock signal generator comprising:
   phase locked loop means for generating a set of clock signals which further comprises a first adjustable dividing means for adjusting the clock signal rate at the output of the loop;
   means for generating a reference signal for the loop wherein the reference signal generating means comprises a voltage controlled crystal oscillator;
   second adjustable dividing means coupling the reference signal generating means to the loop for further adjusting the clock signal rate;
   feedback means for sensing the output frequency of said oscillator and providing correction signals for application to said oscillator to adjust the output frequency of the oscillator to a selected value; and
   wherein said feedback means comprises a counter, a first microprocessor connected to receive counter output, and a digital to analog converter for applying signals from the first microprocessor to the oscillator.

2. A clock signal generator according to claim 1 wherein the crystal circuit of the oscillator comprises a variable capacitance device, variation of said capacitance device varying the output frequency of said oscillator.

3. A clock signal generator according to claim 3 wherein the first adjustable dividing means further comprises a dual modulus prescaler.

4. A clock signal generator according to claim 2 further comprising a third adjustable dividing means for dividing the loop output by $2^n$ where n is an integer.

5. A clock signal generator according to claim 4 wherein the first adjustable dividing means, the second adjustable dividing means, and the third adjustable dividing means are adjustable under the control of a second microprocessor.

6. A clock signal generator according to claim 4 wherein the first adjustable dividing means, the second adjustable dividing means, and the third adjustable dividing means are adjustable under the control of the first microprocessor.

7. A clock signal generator according to claim 6 wherein the first microprocessor has associated memory means for storing a look-up table containing values of the division ratios of said dividing means for each selectable clock signal frequency.

8. A clock signal generator according to claim 6 wherein the first microprocessor is also used to adjust the frequency of the crystal oscillator.

9. A clock signal generator according to claim 1 wherein the first adjustable dividing means further comprises a dual modulus prescaler.

10. A clock signal generator according to claim 9 further comprising a third adjustable dividing means for dividing the loop output by $2^n$ where n is an integer.

11. A clock signal generator according to claim 10 wherein the first adjustable dividing means, the second adjustable dividing means, and the third adjustable dividing means are adjustable under the control of a microprocessor.

* * * * *

UNITED STATES PATENT AND TRADEMARK OFFICE
CERTIFICATE OF CORRECTION

PATENT NO. : 4,835,491

DATED : May 30, 1989

INVENTOR(S) : John Howard Coster

It is certified that error appears in the above-identified patent and that said Letters Patent is hereby corrected as shown below:

In the Claims:

In Claim Number 3, Column 4, Line 32, "claim 3" should read -- claim 2 --;

In Claim Number 4, Column 4, Line 35, "claim 2" should read -- claim 3 --.

Signed and Sealed this

Twenty-fifth Day of February, 1992

Attest:

HARRY F. MANBECK, JR.

*Attesting Officer*      *Commissioner of Patents and Trademarks*